US008736473B2

(12) United States Patent
Dijkmans et al.

(10) Patent No.: US 8,736,473 B2
(45) Date of Patent: May 27, 2014

(54) LOW POWER HIGH DYNAMIC RANGE SIGMA-DELTA MODULATOR

(75) Inventors: Carel Dijkmans, Eindhoven (NL); Robert van Veldhoven, Dommelen (NL); Ben Kup, Eindhoven (NL); Leon van der Dussen, Nuenen (NL); Harry Neuteboom, Eindhoven (NL)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 12/857,474

(22) Filed: Aug. 16, 2010

(65) Prior Publication Data

US 2012/0038500 A1 Feb. 16, 2012

(51) Int. Cl.
*H03M 3/00* (2006.01)

(52) U.S. Cl.
USPC ............................................ 341/143; 341/155

(58) Field of Classification Search
USPC .................................................. 341/143, 155
See application file for complete search history.

(56) References Cited

U.S. PATENT DOCUMENTS

| 6,873,276 B2* | 3/2005 | Yang et al. ............... 341/143 |
| 6,956,514 B1* | 10/2005 | Melanson et al. ........... 341/143 |
| 7,034,728 B2* | 4/2006 | Luh et al. ................. 341/143 |
| 7,049,990 B2* | 5/2006 | Ranganathan ............. 341/143 |
| 7,158,063 B2 | 1/2007 | Motz et al. |
| 7,375,666 B2* | 5/2008 | Melanson ................. 341/143 |
| 7,423,567 B2* | 9/2008 | Melanson ................. 341/143 |
| 7,525,464 B2* | 4/2009 | Maloberti et al. ........... 341/143 |
| 7,623,053 B2* | 11/2009 | Terry et al. ............... 341/143 |
| 7,701,372 B1* | 4/2010 | Jiang et al. ............... 341/143 |
| 7,893,855 B2 | 2/2011 | Huang |
| 8,130,127 B1* | 3/2012 | Tsang et al. .............. 341/143 |
| 8,319,674 B2* | 11/2012 | Loeda et al. .............. 341/143 |
| 2009/0079606 A1* | 3/2009 | Terry et al. ............... 341/143 |
| 2011/0050471 A1* | 3/2011 | Kumar .................... 341/143 |

FOREIGN PATENT DOCUMENTS

CN 101677235 A 3/2010

OTHER PUBLICATIONS

Hyunsik Park, Kiyoung Nam, David K. Su, Katelijn Vleugels and Bruce A. Wooley, "A 0.7-V 870-uW Digital-Audio CMOS Sigma-Delta Modulator," IEEE Journal of Solid-State Circuits, vol. 44, No. 4, Apr. 2009, pp. 1078-1088.
Rocha et al., "Architectures for A/D Conversion with Optimal Use of Oversampling," 1996 IEEE ISCAS, Circuits and Systems Connecting the World, Atlanta, May 12-15, 1996, pp. 37-40.

* cited by examiner

*Primary Examiner* — Linh Nguyen (57) ABSTRACT

A low power, high dynamic range sigma-delta modulator comprises a quantizer followed by a digital integrator for generating an integrated digital signal from a quantized signal. The output of the digital integrator is coupled to a digital-to-analog converter in the feedback loop of the sigma-delta modulator.

8 Claims, 9 Drawing Sheets

LOW POWER HIGH DYNAMIC RANGE SIGMA-DELTA MODULATOR

The invention relates to sigma-delta modulators, and more particularly to low power, high dynamic range sigma-delta modulators.

Sigma-delta modulators are used for both analog-to-digital conversion and digital-to-analog conversion. A sigma-delta modulator for an analog-to-digital converter (ADC) produces a digital output with a bit density proportional to the analog level of the input signal. An analog-to-digital converter of the sigma-delta type may include a sigma-delta modulator and a digital filter connected to the output of the sigma-delta modulator. The purpose of the digital filter is to attenuate signals and noise outside the signal band. The analog-to-digital converter may further include a decimator coupled to the output of the digital filter to reduce the data rate from the oversampling rate to the Nyquist rate.

Sigma-delta modulators comprise noise shaping filters (loop filters), which performs noise shaping on the input signal, an oversampled quantizer, which samples the input signal at a frequency much higher than the input frequency of interest, and a digital-to-analog converter (DAC) in a feedback loop. The output of the digital-to-analog converter is subtracted from the input signal at a summing stage and the signal is then fed back into the loop filters. Noise shaping distributes the quantization error introduced by the quantizer such that the error mainly lies outside the frequency band of interest. Oversampling decreases the quantization noise in the frequency band of interest. Oversampling is typically done at a frequency higher than the Nyquist frequency (twice the input signal bandwidth). The loop filter is considered an integrator in the continuous-time domain and may be a low pass or a band pass filter. A sigma-delta modulator with a low pass filter acts as a low pass filter to the input signal and a high pass filter to the quantization noise.

A first-order sigma-delta modulator consists of a single integrator. Higher-order sigma-delta modulators having more than one integrator stage may be used to increase the effectiveness of the noise shaping. The quantizer is typically a single-bit quantizer followed by a single-bit digital-to-analog converter.

In sigma-delta modulators comprising a multi-bit digital-to-analog converter, the input stage of the integrators only has to handle a small error signal as opposed to the full signal swing when a single-bit digital-to-analog converter is used. However, a multi-bit quantizer is a complex component and requires more power compared to a single-bit quantizer. Furthermore, a high dynamic range is desired to improve quality in the analog-to-digital conversion. However, the complete dynamic range can only be handled by range switching, which leads to unwanted signal dynamics artifacts.

Some sigma-delta modulators use a multi-bit quantizer but only power the comparator that has a changing input. However, a control loop is needed to track the changing input to the quantizer and such a modulator can only be used when the input to the quantizer changes relatively slowly.

In view of these concerns, there is a need for a low power, high dynamic range sigma-delta modulator.

A low power, high dynamic range sigma-delta modulator comprises a quantizer followed by a digital integrator for generating an integrated digital signal from a quantized signal. The output of the digital integrator is coupled to a digital-to-analog converter in the feedback loop of the sigma-delta modulator.

A sigma-delta modulator in accordance with an embodiment of the invention comprises one or more analog filters arranged to generate an integrated signal from a combination of an analog input signal and a feedback signal, a quantizer coupled to the one or more analog filters, the quantizer arranged to generate a quantized signal from the integrated signal, a digital integrator coupled to the quantizer for generating a digital signal from at least the quantized signal, and a digital to analog converter coupled to an output of the digital integrator, the digital-to-analog converter arranged to receive the digital signal and generate the feedback signal. The quantizer may be a single-bit quantizer, where the quantized signal is a single-bit signal. The digital-to-analog converter may be a multi-bit digital-to-analog converter, where the digital signal is a multi-bit signal.

An analog-to-digital converter in accordance with an embodiment of the invention comprises a sigma-delta modulator including one or more analog filters arranged to generate an integrated signal from a combination of an analog input signal and a feedback signal, a quantizer coupled to the analog filters, the quantizer arranged to generate a quantized signal from the integrated signal, a digital integrator coupled to the quantizer for generating a digital signal from at least the quantized signal, and a digital to analog converter coupled to an output of the digital integrator, the digital-to-analog converter arranged to receive the digital signal and generate the feedback signal. The analog-to-digital converter further comprises a digital filter coupled to an output of the sigma-delta modulator. The quantizer may be a single-bit quantizer, and the quantized signal may be a single-bit signal. The digital-to-analog converter may be a multi-bit digital-to-analog converter, and the digital signal may be a multi-bit signal.

A method for converting an analog signal into a digital signal in accordance with an embodiment of the invention comprises generating an integrated signal from a combination of an analog input signal and a feedback signal, generating a quantized single-bit signal from the integrated signal, generating a multi-bit digital signal from the quantized single-bit signal, and converting the multi-bit digital signal into the feedback signal, wherein the feedback signal is an analog signal.

Other aspects and advantages of the present invention will become apparent from the following detailed description, taken in conjunction with the accompanying drawings, illustrated by way of example of the principles of the invention.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
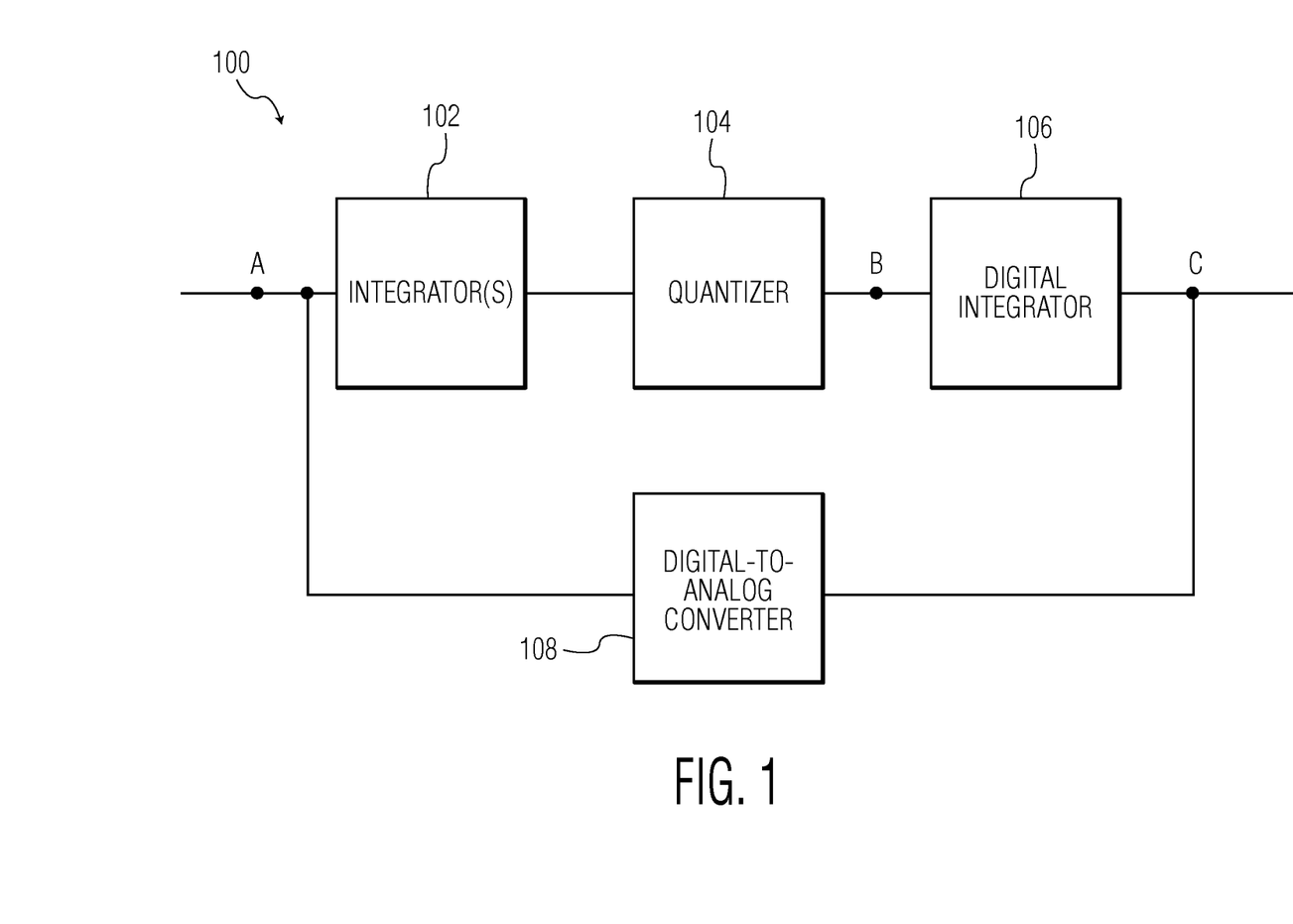
FIG. 1 is a diagram of a sigma-delta modulator in accordance with an embodiment of the invention.

With reference to FIG. 1, a sigma-delta modulator 100 in accordance with an embodiment of the invention is shown. The sigma-delta modulator 100 includes one or more integrators 102, a quantizer 104, a digital integrator 106, and a digital-to-analog converter (DAC) 108. As described in more detail below, the sigma-delta modulator utilizes the one or more integrators and the quantizer in the forward path of the sigma-delta modulator to receive an analog signal, followed by the digital integrator to generate a digital signal. The digital signal is fed to the digital-to-analog converter in the feedback path of the sigma-delta modulator and the output of the digital-to-analog converter and the analog signal are fed into the one or more integrators.

The integrators 102 are analog integrators configured to receive an analog signal and a feedback signal from the digital-to-analog converter 108 and generate an integrated signal. In one embodiment, the quantizer 104 is a single-bit quantizer such as a comparator and generates a digital signal in one of at least two states based on the integrated signal. The quantizer oversamples the integrated signal, thus reducing the quantization noise in the frequency band of interest. The digital integrator 106 may be implemented as an up/down counter and is arranged to receive the digital signal from the quantizer and generates a multi-bit digital signal. The digital integrator integrates the received digital signal over a given number of clock cycles and within a range given by the maximum number of levels of the digital integrator, as will be discussed in more detail with reference to FIG. 4.

The digital-to-analog converter 108 is a multi-bit digital-to-analog converter in the feedback loop of the modulator 100 and converts the multi-bit digital signal generated by the digital integrator 106 into a corresponding analog feedback signal. The analog feedback signal tracks the input signal thereby minimizing the difference between the input signal and the feedback signal. Thus, only a small difference has to be handled by the analog integrator coupled to the output of the digital-to-analog converter.

In the example of FIG. 1, node A marks the input to the sigma-delta modulator 100. In one embodiment, the output of the modulator is taken at node C between the digital integrator 106 and the digital-to-analog converter 108. The output at node C will be a multi-bit stream. In an alternative embodiment, the output of the modulator may be taken at node B, in which case a further digital integrator (not shown) should be placed in the signal path at the output of node B.

Figure 2:
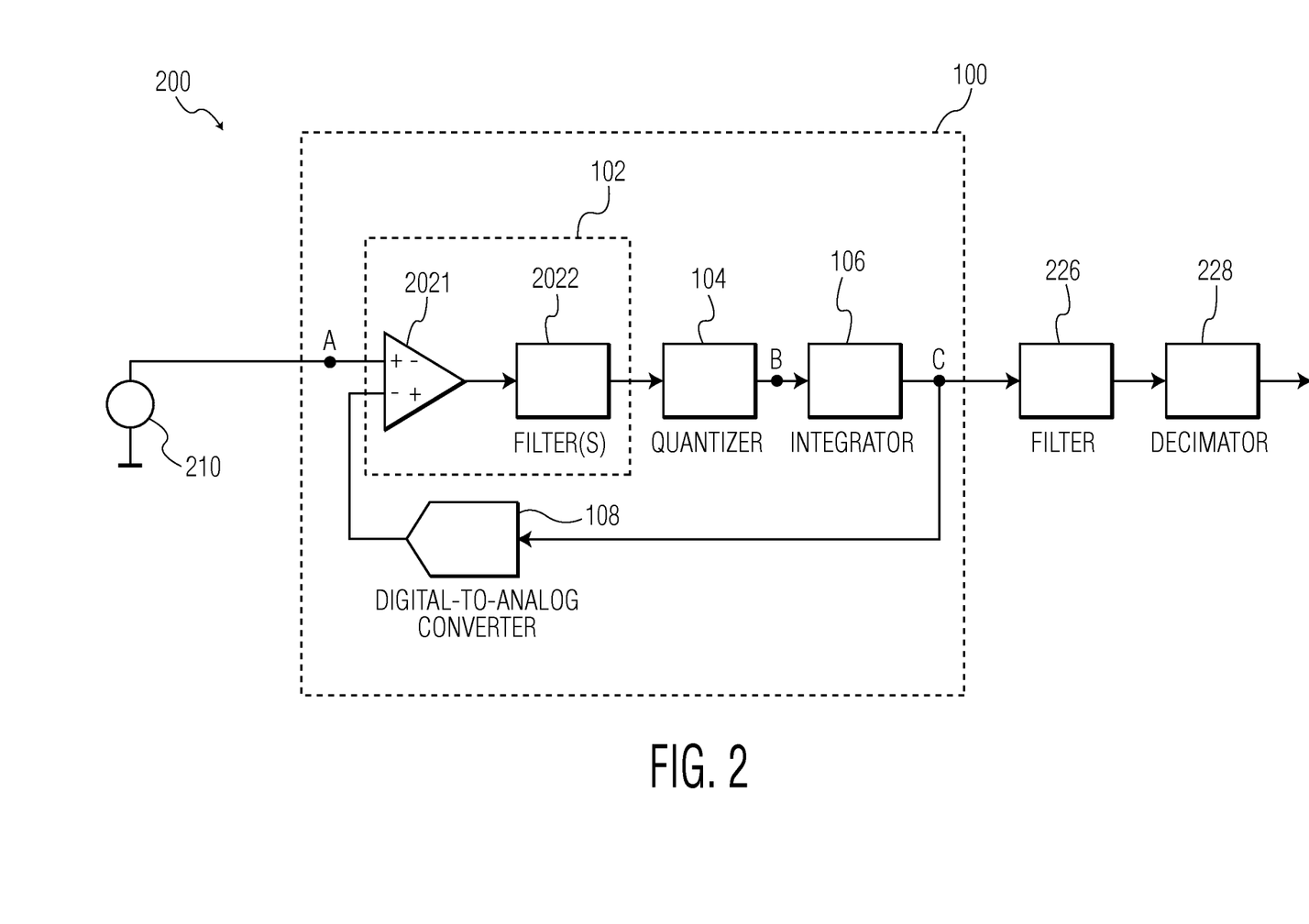
FIG. 2 is a diagram of an analog-to-digital converter in accordance with an embodiment of the invention.

Turning now to FIG. 2, an analog-to-digital converter 200 in accordance with an embodiment of the invention is shown. Similar reference numbers to FIG. 1 indicate common elements in FIG. 2. As shown in FIG. 2, the analog-to-digital converter includes the modulator 100, as described in FIG. 1, for generating a digital signal from an analog input signal from a signal source 210. The modulator 100 includes the analog integrators 102, the quantizer 104, the digital integrator 106, and the digital-to-analog converter 108 in a feedback loop. In the example of FIG. 2, the analog integrators include an error amplifier 2021 and one or more analog filters 2022. The analog-to-digital converter further includes a digital filter 226 and a decimator 228.

The error amplifier 2021 performs an operation on the analog input signal and the feedback signal from the digital-to-analog converter 108. An anti-aliasing filter (not shown) may be used at the input to the error amplifier (node A) to eliminate spectral components above half the sampling frequency of the modulator 100. In one embodiment, the error amplifier subtracts the feedback signal from the input signal and feeds the resulting signal to the filter 2022. The error amplifier may be considered a summing stage and may be part of an analog integrator. The filter integrates a combination of the analog input signal and the feedback signal and may include one or more analog integrators. In the example of FIG. 2, the output of the sigma-delta modulator is taken at node C at the output of the digital integrator 206.

The multi-bit digital output signal from the modulator 100 is fed into the digital filter 226. The digital filter 226 attenuates signals and noise outside the signal band and is connected to the decimator 228 to reduce the data rate from the oversampled signal without losing information.

Figure 3:
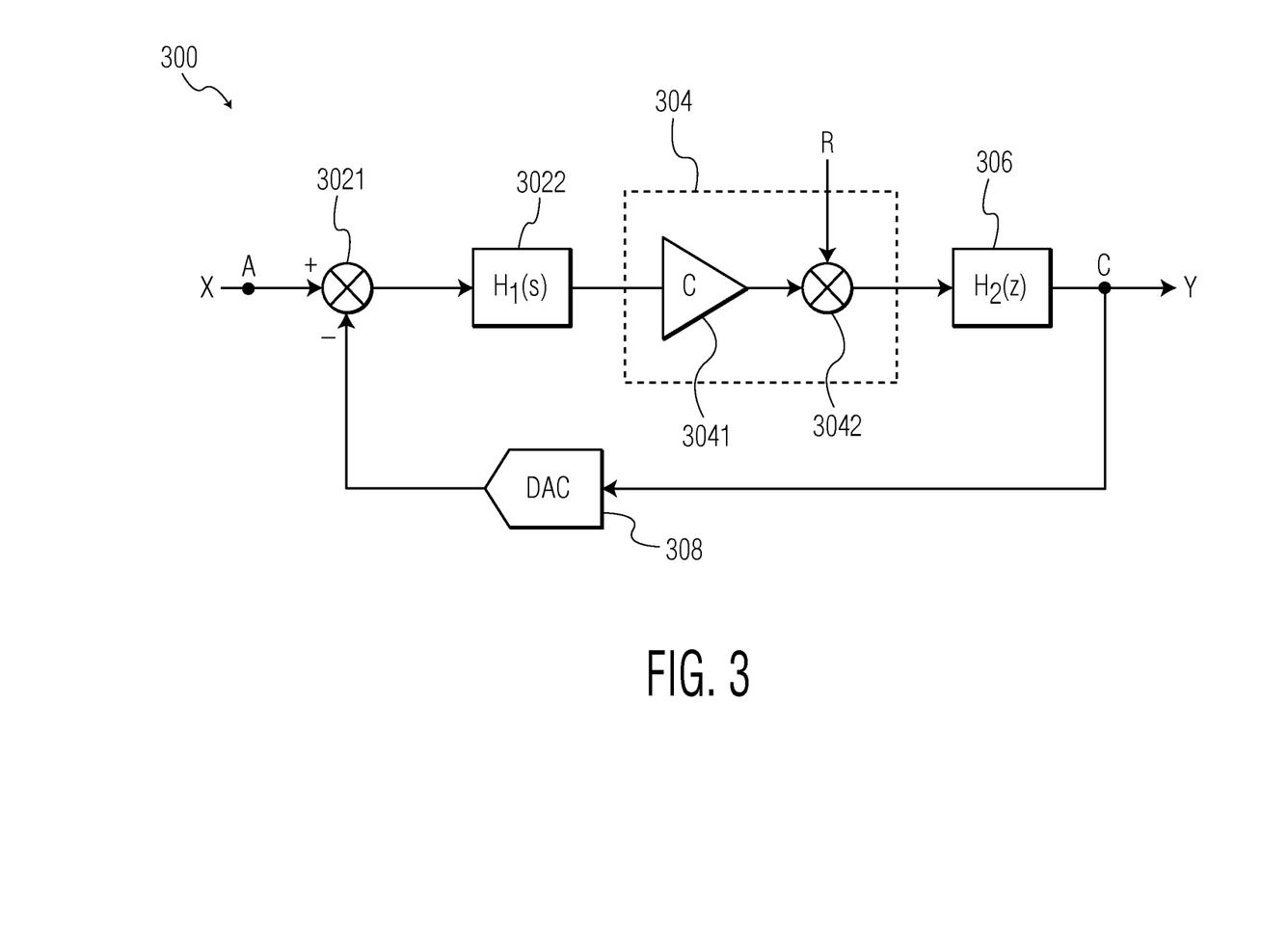
FIG. 3 is diagram of a model representation of a sigma-delta modulator in accordance with an embodiment of the invention.

Turning now to FIG. 3, a model representation of the sigma-delta modulator 100 as described in FIG. 1 in accordance with an embodiment of the invention is shown. Similar reference numbers to FIG. 1 and FIG. 2 indicate common elements in FIG. 3. As shown in FIG. 3, the sigma-delta modulator 300 includes a summing stage 3021, an analog filter 3022, a quantizer 304, a digital integrator 306, and a digital-to-analog converter 308 in the feedback loop. $H_1(s)$ is the transfer function (frequency response) of the filter 3022 and is described in the Laplace domain (s-domain). The quantizer 304 is modeled as a gain c, represented by an amplifier 3041, followed by an addition of quantization noise R, represented by an adder 3042. The quantization noise is a result of the quantized signal having a finite number of levels that is not equal to the actual signal, which is analog and thus has an infinite number of levels. $H_2(z)$ is the transfer function (frequency response) of the digital integrator 306. Since the filter 306 is implemented as a digital circuit, the response of the filter is described below in the z-domain. Poles of a transfer function are the frequencies for which the value of the transfer function becomes infinite, whereas zeros of a transfer function are the frequencies for which the value of the transfer function becomes zero.

In the example of FIG. 3, Y is the multi-bit digital output and X is the analog input to the modulator. Thus, the transfer of the wanted signal, Y/X, should be 1 and transfer of quantization noise, Y/R, should be as low as possible. The approximation holds for $cH_1H_2$ and $H_2$ being very large. Then the transfer of signal becomes 1 and the transfer of noise becomes the inverted frequency response $H_1$ of the filter 3022 and the quantizer gain c. The digital output Y is given by:

$$Y = \frac{cH_1H_2}{1+cH_1H_2}X + \frac{H_2}{1+cH_1H_2}R \quad (1)$$

Provided that $cH_1H_2$ and $H_2$ are very large, equation (1) can be written as:

$$Y \approx X + \frac{1}{cH_1}R \quad (2)$$

From equation (2), it can be seen that $H_2$ does not influence the noise shaping function. $H_2$ only determines the feedback signal.

Figure 4:
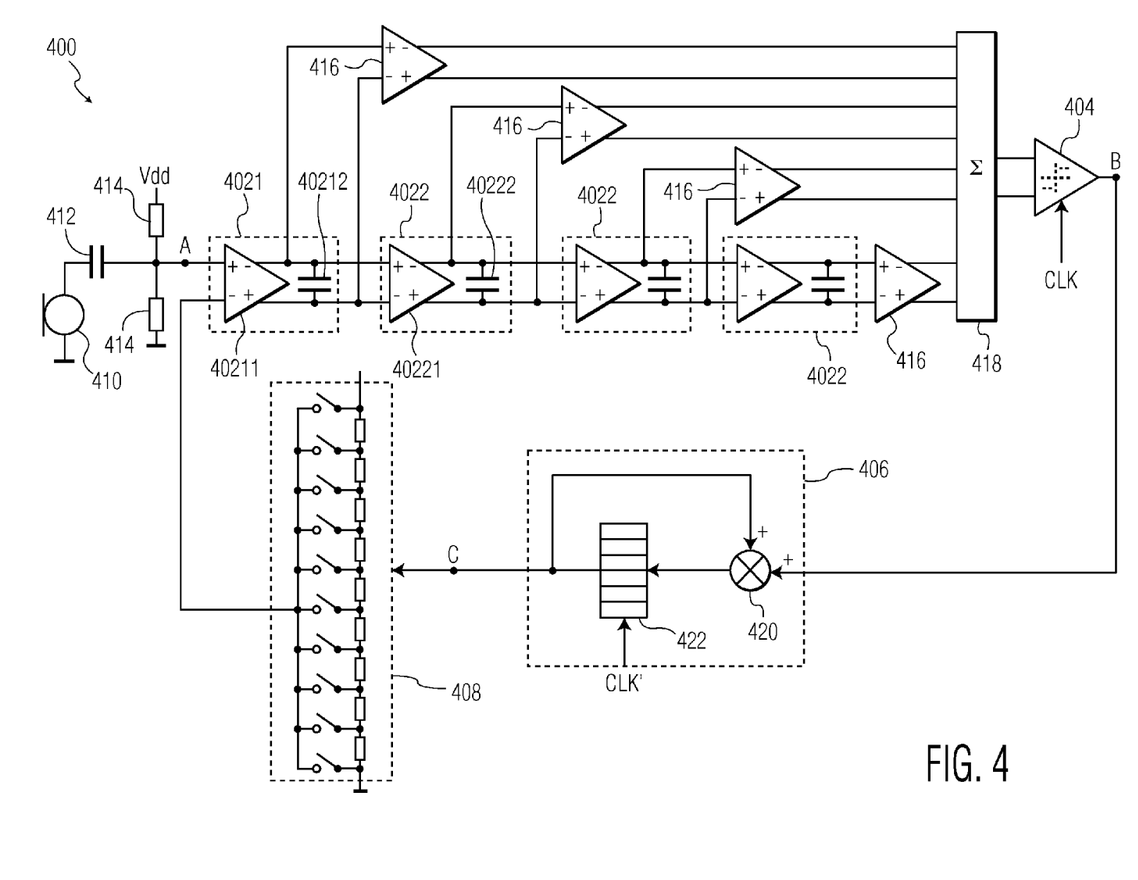
FIG. 4 is a circuit diagram of a sigma-delta modulator in accordance with an embodiment of the invention.

Turning now to FIG. 4, a sigma-delta modulator 400 in accordance with an embodiment of the invention is shown. Similar reference numbers to FIG. 1 indicate common elements in FIG. 4. As shown in FIG. 4, the sigma-delta modulator includes an error amplifier 4021, analog integrators 4022, feed-forward amplifiers 416, a summing stage 418, a quantizer 404, a digital integrator 406, and a digital-to-analog converter 408.

In the example of FIG. 4, the error amplifier 4021 is arranged to subtract two single-ended signals and generate an amplified differential signal, where the two output lines from the error amplifier represent a positive and a negative variant of the same signal. A first of the two single ended signals is an analog input signal from a signal source 410. The second of the two single ended signals is a feedback signal from the digital-to-analog converter 408. The digital-to-analog converter may for example be a resistive digital-to-analog converter. The signal source 410 may be any source providing an analog signal. In a non-limiting example, the signal source may be a microphone and the input to the modulator may further include a coupling capacitor 412 and high-ohmic resistors 414 to provide AC coupling and adjust the DC level so that the maximum signal from the signal source fits between the upper and lower reference levels of the digital-to-analog converter.

In the illustrated embodiment, the error amplifier 4021 includes an amplifier 40211 with a capacitor 40212 coupled to the differential output of the amplifier 40211 and may constitute an analog integrator. Similarly, each of the integrators 4022 may include, but are not limited to, an amplifier 40221 with a capacitor 40222 coupled to the output of the amplifier 40221, as illustrated in FIG. 4. In a non-limiting example, the amplifier 40211 and/or the amplifiers 40221 may be operational transconductance amplifiers (OTA) having a voltage input and a current output.

In the example of FIG. 4, the sigma-delta modulator 400 is a fifth order modulator made of four analog integrators and a digital integrator. The output of each of the analog integrators is amplified with a certain gain at the feed-forward amplifiers 416, and the amplified outputs are summed at the summing stage 418. The gains of the amplifiers 416 correspond to the feed-forward coefficients, which together determine the position of the zeros in the loop. The summed output from the summing stage 418 is sampled and quantized to two levels at the quantizer 404 at every clock cycle of the quantizer, which is controlled by a clock signal Clk applied to the quantizer. The digital integrator 406 converts the two level signal into a signal with multiple levels by integrating the two level signal at each clock cycle to obtain a signal at one of a number of levels within a certain range. In an illustrative example, the range of the digital integrator may be given by a 6-bit digital word and the signal resulting from the integration of the two level signals may have one of 64 levels. The output of the digital integrator is fed to the multi-bit digital to analog converter 408 and the loop is closed.

In the example of FIG. 4, the digital integrator 406 includes an adder 420 and a register 422. The digital integrator is implemented as an up/down counter limited by the range of a given bit-length. After each clock cycle, as defined by another clock signal Clk', the digital integrator counts either 1 up or 1 down depending on the quantizer output, but may clip when the count reaches the boundaries given by the bit-length. The clock signal Clk applied to the quantizer 404 and the clock signal Clk' applied to the digital integrator should have the same period and the time between quantization at the quantizer and the corresponding count at the digital integrator should be less than a full clock cycle.

Figure 5:
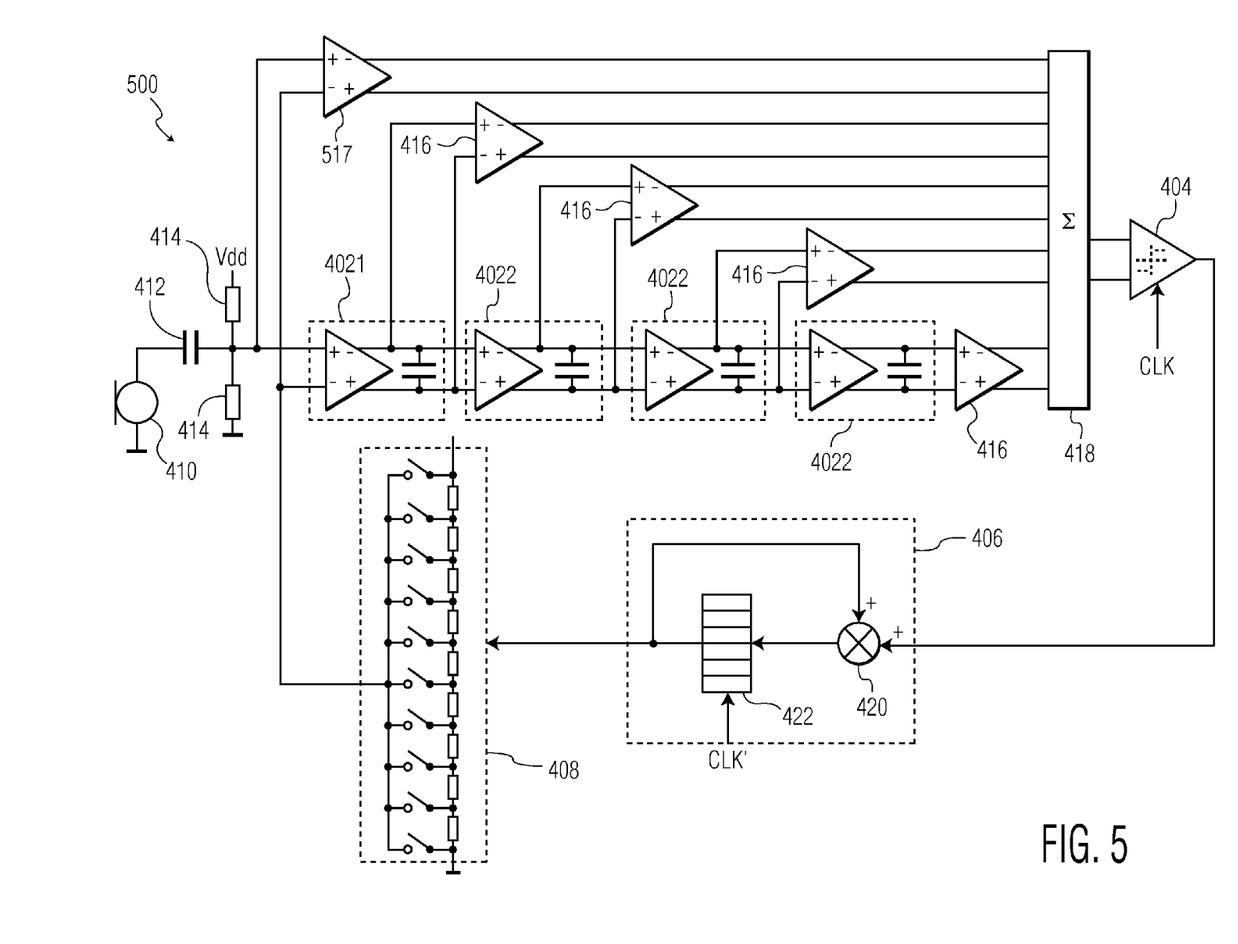
FIG. 5 is a diagram of a sigma-delta modulator with an additional feed forward branch in accordance with an embodiment of the invention.

Turning now to FIG. 5, a sigma-delta modulator 500 in accordance with an embodiment of the invention is shown. In the example of FIG. 5, stability is improved compared to the example of FIG. 4. As shown in FIG. 5, the sigma-delta modulator 500 includes the error amplifier 4021, the analog integrators 4022, the feed-forward amplifiers 416, the additional feed-forward amplifier 517, the summing stage 418, the quantizer 404, the digital integrator 406, and the digital-to-analog converter 408. Stability of the modulator may be improved by providing a modulator with an equal number of integrators (poles) and feed-forward coefficients (zeros). In the example of FIG. 5, stability in the modulator loop is provided by an additional feed-forward amplifier 517 disposed in a feed-forward loop between the input to the error amplifier 401 and the summing stage 418. The inputs to the amplifier 517 are arranged to receive the analog input signal and the feedback signal. The amplifier 517 provides an additional feed-forward coefficient to the summing stage.

Figure 6:
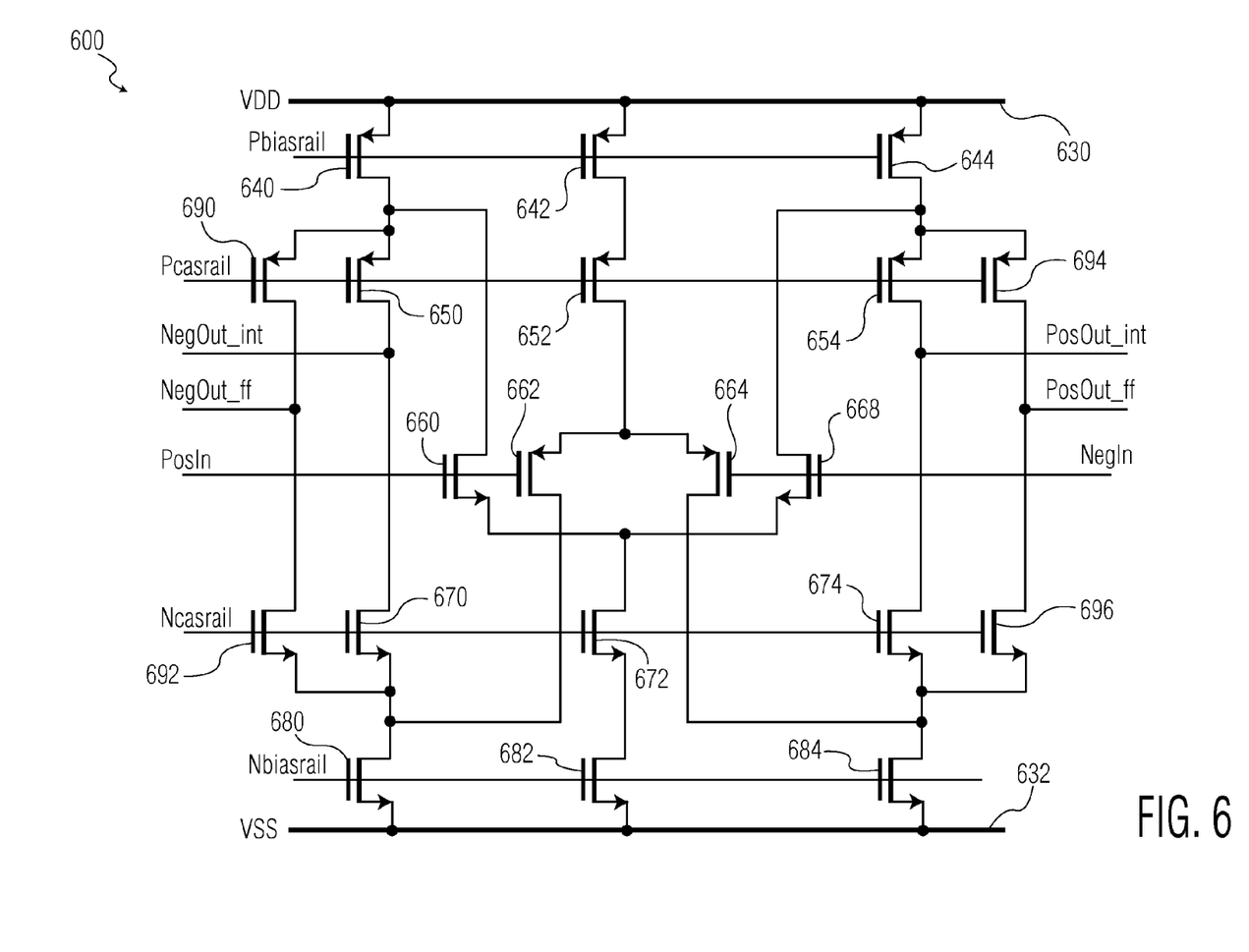
FIG. 6 is a diagram of a rail-to-rail error amplifier in accordance with an embodiment of the invention.

Turning now to FIG. 6, a rail-to-rail input amplifier 600 in accordance with an embodiment of the invention is shown. The rail-to-rail input amplifier 600 may be used as one of the integrators 102 in FIG. 1 and as the error amplifier 2021 of FIG. 2. As shown in FIG. 6, the rail-to-rail input amplifier 600 includes transistors 640 to 684 disposed between rails 630 and 632 at voltages VDD and VSS, respectively.

FIG. 6 illustrates an input amplifier 600 consisting of a pmos and an nmos differential pair of transistors. However, the input amplifier is not limited to a pmos and nmos configuration as illustrated. For example, the input amplifier may consist of a single pmos input pair and a local charge pump to supply a tail current. The input amplifier only needs to handle a relatively small differential signal, but it has to handle the full input swing as common mode signal. For the upper part of the signal, the nmos differential pair 664 and 668 is active and for the lower part of the signal, the pmos differential pair 660 and 662 is active. In the middle (or for small signal swings) both pairs are active.

In the example of FIG. 6, the input amplifier includes transistor current sources 640, 642, and 644 connected to a bias rail Pbiasrail and transistor current sources 680, 682, and 684 connected to a bias rail Nbiasrail. The input amplifier further includes cascode transistors 650, 652, and 654 and cascode transistors 670, 672, and 674. In the example of FIG. 6, differential pair transistors 660 and 662 and differential pair transistors 664 and 668 are coupled to inputs PosIn and NegIn of the input amplifier 600, respectively.

Figure 7:
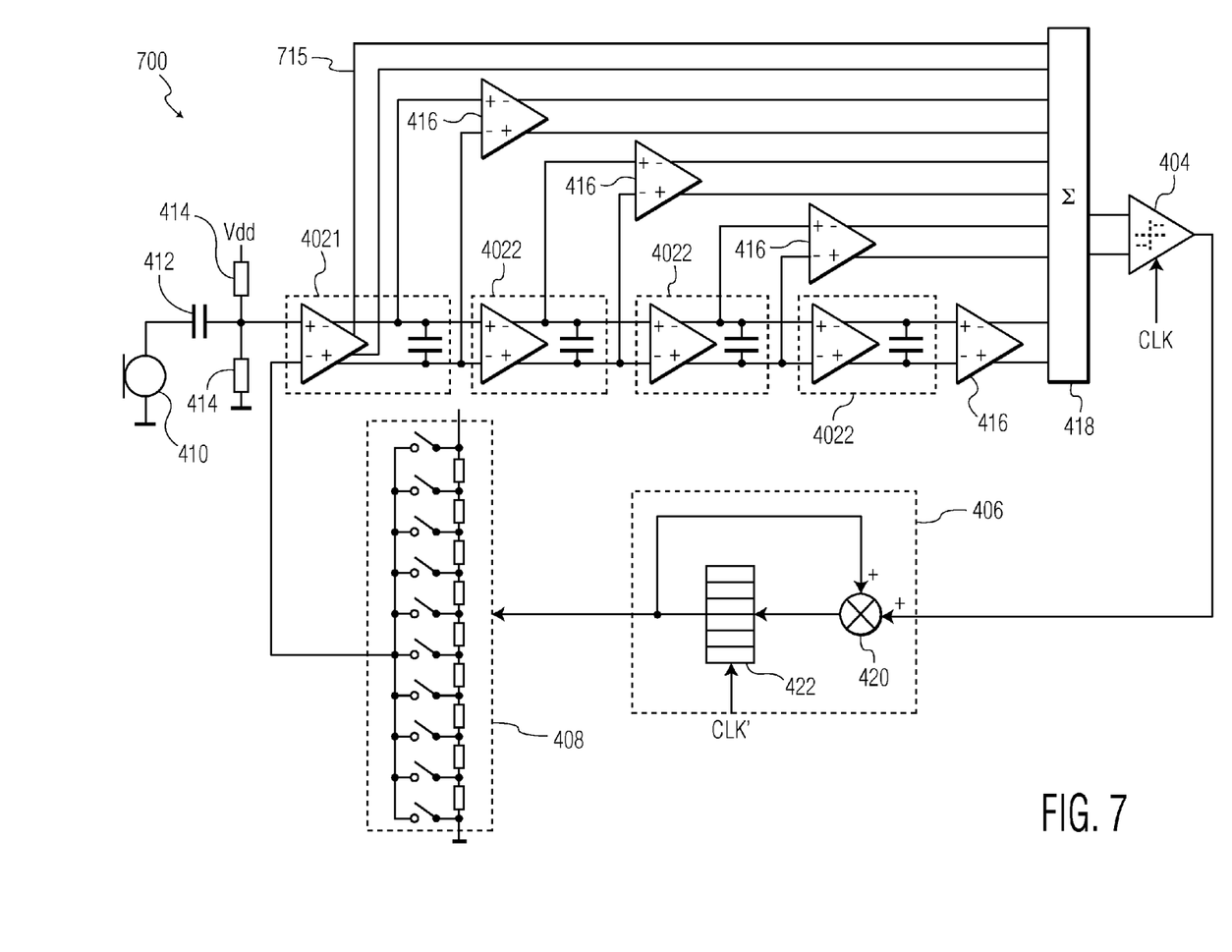
FIG. 7 is a diagram of a sigma-delta modulator with an additional feed forward branch in accordance with another embodiment of the invention.

In one embodiment, additional outputs of the input amplifier 600 are created as differential outputs NegOut_ff and PosOut_ff by transistors 690-692 and 694-696. In the input amplifier with the differential pair transistors 660-668, a part of the current is split off in the cascode stage at the outputs NegOut_ff and PosOut_ff to provide an additional feed-forward coefficient. The additional outputs are used in a feed-forward loop, as illustrated in FIG. 7. The additional outputs generate an additional zero in the modulator loop to provide stability to the modulator.

Turning now to FIG. 7, a sigma-delta modulator 700 with an additional feed-forward branch in accordance with another embodiment of the invention is shown. Instead of providing additional stability by using the additional amplifier 517 described with reference to FIG. 5, stability in the example of FIG. 7 is provided by additional outputs to the error amplifier 4021. As shown in FIG. 7, the sigma-delta modulator 700 includes the error amplifier 4021, the analog integrators 4022, the feed-forward amplifiers 416, the additional feed-forward loop 715, the summing stage 418, the quantizer 404, the digital integrator 406, and the digital-to-analog converter 408.

In the example of FIG. 7, stability in the modulator loop is provided by an additional feed-forward loop 715 from additional outputs of the error amplifier 4021. The additional feed-forward loop generates an additional zero in the modulator loop. The additional outputs of the error amplifier 4021 may be obtained using the rail-to-rail input amplifier 600 described with reference to FIG. 6. Other configurations of the error amplifier 4021 are also possible to provide the additional outputs of the error amplifier. For example, a second error amplifier in parallel to the single-ended inputs (input signal and feedback signal) may be implemented to provide the additional feed-forward coefficient.

Figure 8:
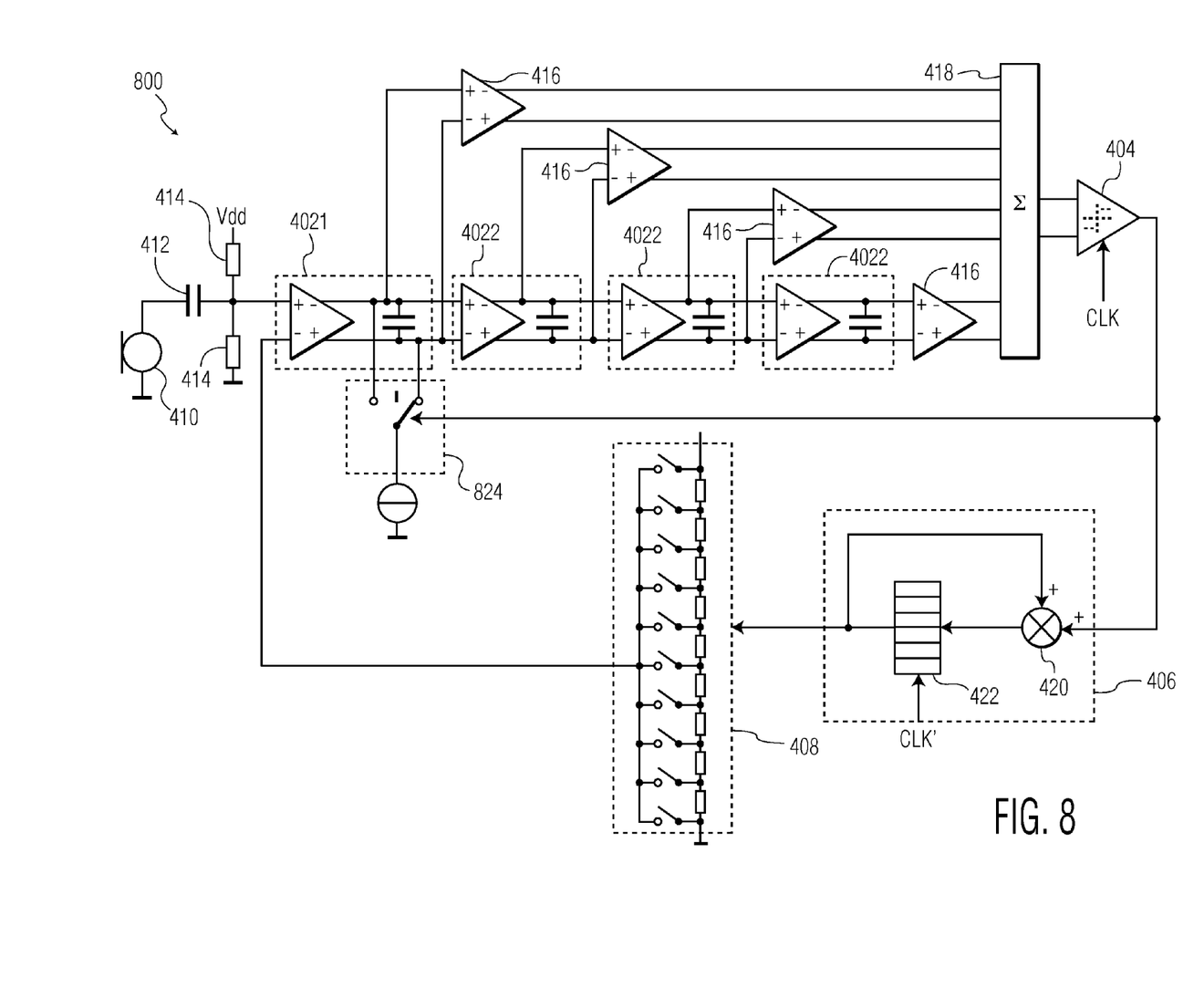
FIG. 8 is a diagram of a sigma-delta modulator with an additional digital-to-analog converter in accordance with another embodiment of the invention.

Turning now to FIG. 8, a sigma-delta modulator 800 with an additional feed forward branch in accordance with another embodiment of the invention is shown. As shown in FIG. 8, the sigma-delta modulator includes the error amplifier 4021, the analog integrators 4022, the feed-forward amplifiers 416, the additional feed-forward amplifier 517, the summing stage 418, the quantizer 404, the digital integrator 406, and the digital-to-analog converter 408.

In the example of FIG. 8, stability in the modulator 800 is achieved by placing a second digital-to-analog converter 824 in the feedback loop. In an exemplary embodiment, the second analog-to-digital converter is coupled between the output of the quantizer 404 and the output of the error amplifier 401. The second digital-to-analog converter generates an additional zero in the modulator loop to provide stability in the modulator.

Figure 9:
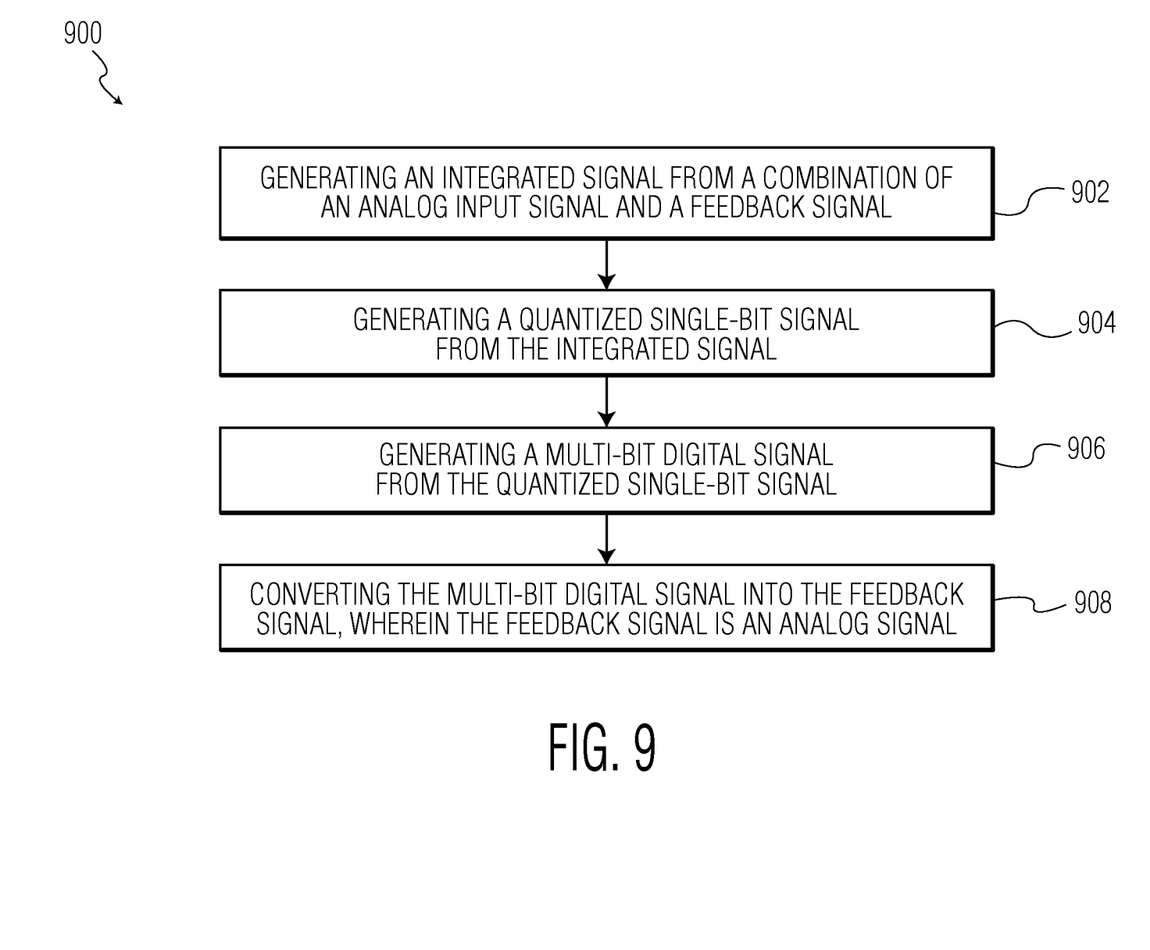
FIG. 9 is a flowchart of a method for converting an analog signal into a digital signal in accordance with an embodiment of the invention.

A method for converting an analog signal into a digital signal using a converter, such as the sigma-delta converter 100, in accordance with an embodiment of the invention is now described with reference to a flow diagram of FIG. 9. At block 902, an integrated signal is generated from a combination of an analog input signal and a feedback signal. Next, at block 904, a quantized single-bit signal is generated from the integrated signal. Next, at block 906, a multi-bit digital signal is generated from the quantized single-bit signal. Next, at block 908, the multi-bit digital signal is converted into the feedback signal, where the feedback signal is an analog signal.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods may be implemented using software instructions stored on a computer useable storage medium for execution by a computer system. As an example, an embodiment of a computer program product includes a computer useable storage medium to store a computer readable program that, when executed on a computer system, causes the computer system to perform operations, as described herein.

For the purposes of this description, a computer-usable or computer readable medium can be any apparatus that can contain, store, communicate, propagate, or transport the program for use by or in connection with the computer system, instruction execution system, apparatus, or device. The computer-useable or computer-readable medium can be an electronic, magnetic, optical, electromagnetic, infrared, or semiconductor system (or apparatus or device), or a propagation medium. Examples of a computer-readable medium include a semiconductor or solid state memory, magnetic tape, a removable computer diskette, a random access memory (RAM), a read-only memory (ROM), a rigid magnetic disk, and an optical disc. Current examples of optical discs include a compact disc with read only memory (CD-ROM), a compact disc with read/write (CD-R/W), a digital versatile disc (DVD), and a Blu-ray disc (BD).

Furthermore, embodiments of at least portions of the invention can take the form of a computer program product accessible from a computer-usable or computer-readable medium providing program code for use by or in connection with a computer system or any instruction execution system. For example, the digital integrator and/or other components of the embodiments of the invention may be implemented as software in a computer system, while the quantizer and the digital integrator may be implemented as hardware or electrical circuits.

In one embodiment, the computer system that can be utilized to implement the digital integrator and/or other components includes one or more processors and memory, and may further include other devices such as communication devices (e.g., storage interfaces, network interfaces) and interconnects (e.g., buses, peripherals). The processor(s) may include central processing units (CPUs) and thus control operation of the computer system. In certain embodiments, the processor(s) accomplish this by executing software or firmware stored in memory. The processor(s) may be, or may include, one or more programmable general-purpose or special-purpose microprocessors, digital signal processors (DSPs), application specific integrated circuits (ASICs), programmable controllers, programmable logic devices (PLDs), or the like, or a combination of such devices. The memory may be or may include random access memory (RAM), read-only memory (ROM), flash memory, or the like, or a combination of such devices and may include the main memory of the computer system. In operation, the memory may contain, among other things, a set of machine instructions which, when executed by the processor(s), causes the processor(s) to perform operations to implement embodiments of the present invention.

In addition, although specific embodiments of the invention that have been described or depicted include several components described or depicted herein, other embodiments of the invention may include fewer or more components to implement less or more feature.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A sigma-delta modulator comprising:
    a plurality of analog filters arranged to generate an integrated differential signal from a combination of an analog input signal and a feedback signal, wherein the analog filters are integrators connected to two output lines and output signals from the two output lines represent a positive variant and a negative variant of the integrated differential signal;
    a quantizer coupled to the analog filters, the quantizer arranged to generate a quantized signal from the integrated differential signal;
    a digital integrator coupled to the quantizer for generating a digital signal from at least the quantized signal;
    a digital to analog converter coupled to an output of the digital integrator, the digital-to-analog converter arranged to receive the digital signal and generate the feedback signal;
    an error amplifier arranged to receive the analog input signal and the feedback signal, wherein the feedback signal is subtracted from the analog input signal at the error amplifier, and a differential output signal of the error amplifier is fed into the integrators;
    a summing stage arranged between the integrators and the quantizer; and
    a plurality of feed-forward branches connected between the integrators and the summing stage, wherein the integrators are serially connected, wherein each of the integrators comprises an amplifier with a capacitor coupled between differential output lines of the amplifier, and wherein each of the feed-forward branches comprises an feed-forward amplifier that is connected to differential input lines of a respective integrator.

2. The sigma-delta modulator of claim 1, wherein the quantizer is a single-bit quantizer, wherein the quantized signal is a single-bit signal.

3. The sigma-delta modulator of claim 1, wherein the digital-to-analog converter is a multi-bit digital-to-analog converter, wherein the digital signal is a multi-bit signal.

4. The sigma-delta modulator of claim 3, wherein the digital integrator includes an adder and a register to convert the quantized signal into the multi-bit digital signal.

5. The sigma-delta modulator of claim 1 further comprising a second feedback digital-to-analog converter directly coupled to an output of the error amplifier.

6. An analog to digital converter comprising:
    a sigma-delta modulator including:
        a plurality of analog filters arranged to generate an integrated differential signal from a combination of an analog input signal and a feedback signal, wherein the analog filters are integrators connected to two output lines and output signals from the two output lines represent a positive variant and a negative variant of the integrated differential signal;
        a quantizer coupled to the analog filters, the quantizer arranged to generate a quantized signal from the integrated differential signal;
        a digital integrator coupled to the quantizer for generating a digital signal from at least the quantized signal; and
        a digital to analog converter coupled to an output of the digital integrator, the digital-to-analog converter arranged to receive the digital signal and generate the feedback signal;
    a digital filter coupled to an output of the sigma-delta modulator;
    an error amplifier arranged to receive the analog input signal and the feedback signal, wherein the feedback signal is subtracted from the analog input signal at the error amplifier, and a differential output signal of the error amplifier is fed into the integrators;
    a summing stage arranged between the integrators and the quantizer; and
    a plurality of feed-forward branches connected between the integrators and the summing stage, wherein the integrators are serially connected, wherein each of the integrators comprises an amplifier with a capacitor coupled between differential output lines of the amplifier, and wherein each of the feed-forward branches comprises an feed-forward amplifier that is connected to differential input lines of a respective integrator.

7. The sigma-delta modulator of claim 6, wherein the quantizer is a single-bit quantizer, wherein the quantized signal is a single-bit signal.

8. The sigma-delta modulator of claim 6, wherein the digital-to-analog converter is a multi-bit digital-to-analog converter, wherein the digital signal is a multi-bit signal.

* * * * *